United States Patent
Hikita et al.

(10) Patent No.: US 6,617,693 B2
(45) Date of Patent: *Sep. 9, 2003

(54) SEMICONDUCTOR DEVICE AND SEMICONDUCTOR CHIP FOR USE THEREIN

(75) Inventors: Junichi Hikita, Kyoto (JP); Hiroo Mochida, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/496,183

(22) Filed: Feb. 2, 2000

(65) Prior Publication Data
US 2002/0017718 A1 Feb. 14, 2002

(30) Foreign Application Priority Data
Feb. 3, 1999 (JP) ............................................. 11-026541

(51) Int. Cl.⁷ ................................................. H01L 23/48
(52) U.S. Cl. ........................ 257/777; 257/686; 257/723; 257/778; 361/735
(58) Field of Search ................................. 257/685, 686, 257/723, 777, 778; 361/729, 730, 736, 790

(56) References Cited

U.S. PATENT DOCUMENTS

| 5,266,912 | A | * | 11/1993 | Kledzik | 333/247 |
|---|---|---|---|---|---|
| 5,608,262 | A | * | 3/1997 | Degani et al. | 257/723 |
| 5,646,828 | A | * | 7/1997 | Degani et al. | 361/715 |
| 5,732,278 | A | * | 3/1998 | Furber et al. | 395/800 |
| 5,760,478 | A | * | 6/1998 | Bozso et al. | 257/777 |
| 5,834,835 | A | * | 11/1998 | Maekawa | 257/680 |
| 5,903,908 | A | * | 5/1999 | Singh et al. | 711/122 |
| 5,949,294 | A | * | 9/1999 | Kondo et al. | 331/68 |
| 5,959,845 | A | * | 9/1999 | Faucher | 361/777 |
| 5,977,640 | A | * | 11/1999 | Bertin et al. | 257/777 |
| 5,994,166 | A | * | 11/1999 | Akram et al. | 438/108 |
| 6,008,530 | A | * | 12/1999 | Kano | 257/686 |
| 6,109,929 | A | * | 8/2000 | Jasper | 439/74 |
| 6,137,164 | A | * | 10/2000 | Yew et al. | 257/686 |
| 6,147,401 | A | * | 11/2000 | Solberg | 257/723 |
| 6,150,724 | A | * | 11/2000 | Wenzel et al. | 257/777 |
| 6,154,370 | A | * | 11/2000 | Degani et al. | 361/761 |
| 6,160,312 | A | * | 12/2000 | Raad | 257/723 |
| 6,160,715 | A | * | 12/2000 | Degani et al. | 361/767 |

* cited by examiner

Primary Examiner—Kamand Cuneo
Assistant Examiner—Lourdes Cruz
(74) Attorney, Agent, or Firm—Arent Fox Kintner Plotkin & Kahn, PLLC

(57) ABSTRACT

A semiconductor device has a first semiconductor chip and a second semiconductor chip superposed on and bonded to the surface of the first semiconductor chip. In the region on the first semiconductor chip where the second semiconductor chip is bonded thereto, connection pads are arranged in positions that fit a plurality of predetermined types of semiconductor chips. On the second semiconductor chip, connection pads are arranged in positions that fit the connection pads arranged on the first semiconductor chip.

7 Claims, 4 Drawing Sheets

SEMICONDUCTOR DEVICE AND SEMICONDUCTOR CHIP FOR USE THEREIN

BACKGROUND OF THE INVENTION

1. Field of the Invention

The present invention relates to a semiconductor device having a chip-on-chip structure, and to a semiconductor chip for use in such a semiconductor device.

2. Description of the Prior Art

Conventionally, semiconductor devices having so-called chip-on-chip structures have been proposed that are built by bonding a semiconductor chip to the surface of another semiconductor chip. A typical example is an LSI chip, constituting a gate array, having another LSI chip, constituting a memory, analog-to-digital conversion device (hereafter referred to as an A/D conversion device), or CPU, superposed and thereby mounted thereon.

However, in a semiconductor device having a chip-on-chip structure, it is necessary to design a pair of semiconductor chips that are to be bonded together to have pads in corresponding positions. For this reason, to upgrade an existing system, for example by increasing the capacity of a memory, by increasing the number of conversion bits of an A/D conversion device, or by increasing the number of processing bits of a CPU, it is necessary to renew not only the design of the LSI chip constituting such a device, but also the design of the gate array LSI chip to which it is bonded. That is, there is no choice but to develop and produce a completely new product.

This means that, every time a system is upgraded, a large amount of human energy needs to be expended on system upgrading including the modification of the manufacturing line.

SUMMARY OF THE INVENTION

An object of the present invention is to provide a semiconductor device having a chip-on-chip structure that allows easy production of various types of semiconductor devices as a whole, and to provide a semiconductor chip for use in such a semiconductor device.

To achieve the above object, according to one aspect of the present invention, a semiconductor device has a first semiconductor chip and a second semiconductor chip superposed on and bonded to the surface of the first semiconductor chip. Moreover, in the region on the surface of the first semiconductor chip where the second semiconductor chip is bonded to the first semiconductor chip, chip connection portions are arranged in standardized positions so as to fit a plurality of predetermined types of semiconductor chips, and, on the second semiconductor chip, chip connection portions are arranged in standardized positions so as to fit the chip connection portions arranged on the first semiconductor chip.

In this structure, on the surface of the first semiconductor chip, chip connection portions are arranged in standardized positions, and, on the second semiconductor chip, chip connection portions are arranged in positions that fit the chip connection portions arranged on the first semiconductor chip. Here, the chip connection portions are arranged in standardized positions in the first semiconductor chip so as to fit a plurality of predetermined types of semiconductor chips, and therefore, as long as the chip connection portions are arranged in similar standardized positions on the second semiconductor chip, different types of semiconductor chips can be used as the second semiconductor chip. In this case, the same first semiconductor chip can be used without modifying the design thereof.

Thus, it is possible to bond various types of semiconductor chips as the second semiconductor chip to the surface of the first semiconductor chip. This makes it easy to produce various types of semiconductor devices, as a whole, having a chip-on-chip structure.

According to another aspect of the present invention, a semiconductor chip has, on the surface thereof, a chip bonding region to which one of a plurality of predetermined types of semiconductor chips is bonded. In this chip bonding region, chip connection portions are arranged in standardized positions so as to fit the plurality of predetermined types of semiconductor chips.

In this structure, the chip connection portions are arranged in standardized positions so as to fit a plurality of predetermined types of semiconductor chips. Thus, there is no need to modify the design of this semiconductor chip to connect any of the plurality of types of semiconductor chips to the chip connection portions to produce a semiconductor device having a chip-on-chip structure.

According to still another aspect of the present invention, a semiconductor chip has a plurality of chip connection portions arranged on the surface thereof in positions standardized among a plurality of predetermined types of semiconductor chips.

In this structure, the chip connection portions are arranged in standardized positions so as to fit a plurality of predetermined types of semiconductor chips. Thus, there is no need to modify the design of this semiconductor chip when another semiconductor chip having chip connection portions arranged in standardized positions corresponding thereto is bonded thereto. This makes it easy to produce a plurality of types of semiconductor devices having chip-on-chip structures.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, an embodiment of the present invention will be described in detail in reference to the accompanying drawings.

Figure 1:
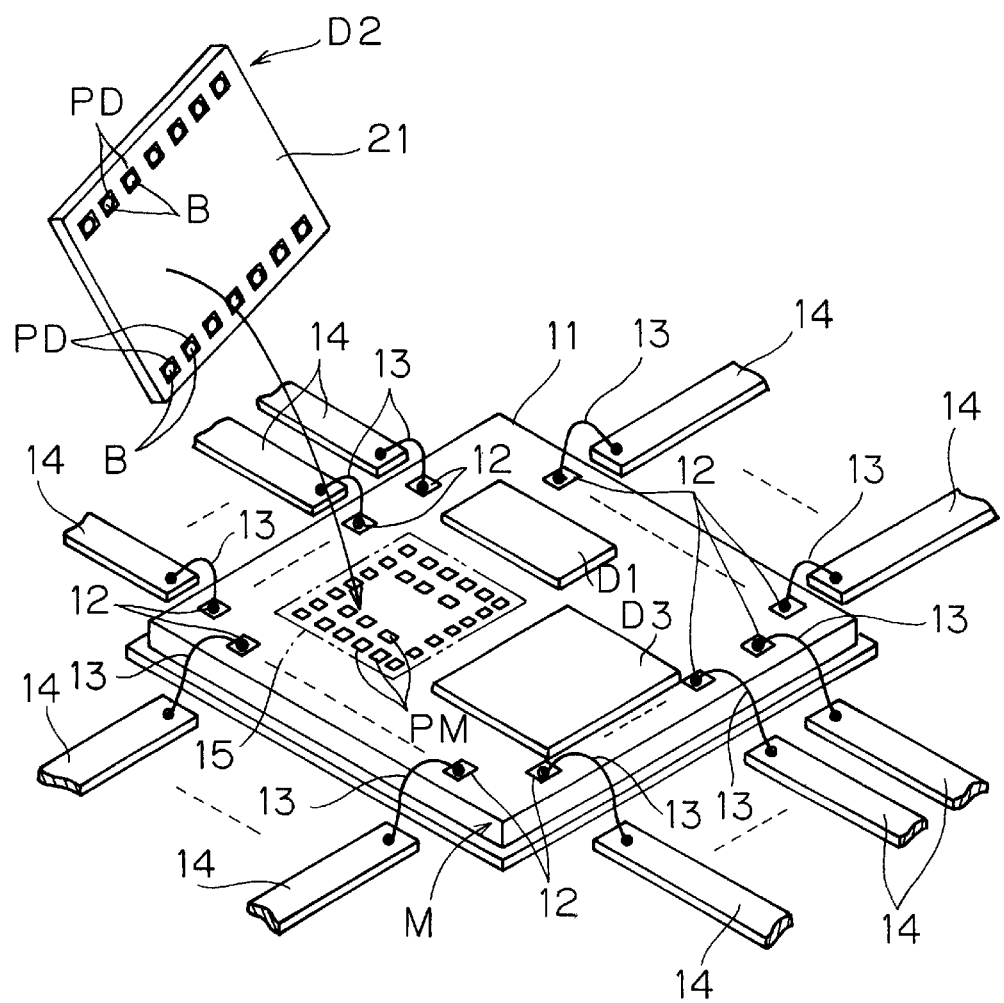
FIG. 1 is a partially exploded perspective view of a semiconductor device embodying the invention.

FIG. 1 is a partially exploded perspective view of a semiconductor device embodying the invention. This semiconductor device has, as a first semiconductor chip, a mother chip M, and has, as a second semiconductor chip, daughter chips D1, D2, and D3 (hereafter also called "the daughter chip D" when referred to generally) individually laid on and bonded to the surface 11 of the mother chip M. Thus, the semiconductor device has a so-called chip-on-chip structure.

The mother chip M is formed out of, for example, a silicon chip. Its surface 11, i.e. that side of the semiconductor substrate constituting the base of the mother chip M on which an active surface-layer region lies in which functional devices such as transistors are formed, is covered with an insulating protective film as the topmost layer. Above this protective film, a plurality of pads 12 for external connection are arranged so as to be exposed in predetermined positions near the edge of the substantially rectangular and flat surface 11 of the mother chip M. These external connection pads 12 are to be connected to lead frames 14 by way of bonding wires 13.

In an inner region on the mother chip M, a bonding region 15 (a chip bonding region; only the one corresponding to the daughter chip D2 is shown here) is provided so as to allow the daughter chip D to be bonded thereto. In this bonding region 15, a plurality of chip-to-chip connection pads PM (chip connection portions) are arranged for achieving connection with the daughter chip D.

The daughter chip D is formed out of, for example, a silicon chip. The surface 21 of the semiconductor substrate constituting the base of this daughter chip D, i.e. that side thereof on which an active surface-layer region lies in which functional devices such as transistors are formed, is covered with an insulating protective film as the topmost layer. Above this protective film, a plurality of pads PD (chip connection portions) are formed so as to be exposed in positions corresponding to the chip-to-chip connection pads PM formed on the mother chip M. On these pads PD individually, bumps B (chip connection portions) are formed that are made of an oxidation-resistant metal such as gold, lead, platinum, silver, or iridium.

The daughter chip D is bonded to the mother chip M with the surface 21 of the former facing the surface 11 of the latter. This bonding is achieved by pressing the mother and daughter chips M and D onto each other until they are bonded together with the bumps B individually kept in contact with the chip connection pads PM formed on the bonding region 15. During this bonding, supersonic vibration is applied, as required, to the mother chip M and/or the daughter chip D to achieve secure bonding between the bumps B and the chip connection pads PM.

For example, the mother chip M has a gate array or logic circuit formed thereon. For example, the first daughter chip D1 is an A/D conversion device, the second daughter chip D2 is a memory device (such as a flash memory, EEPROM, ferroelectric memory, or dynamic RAM), and the third daughter chip D3 is a CPU.

Figure 2:
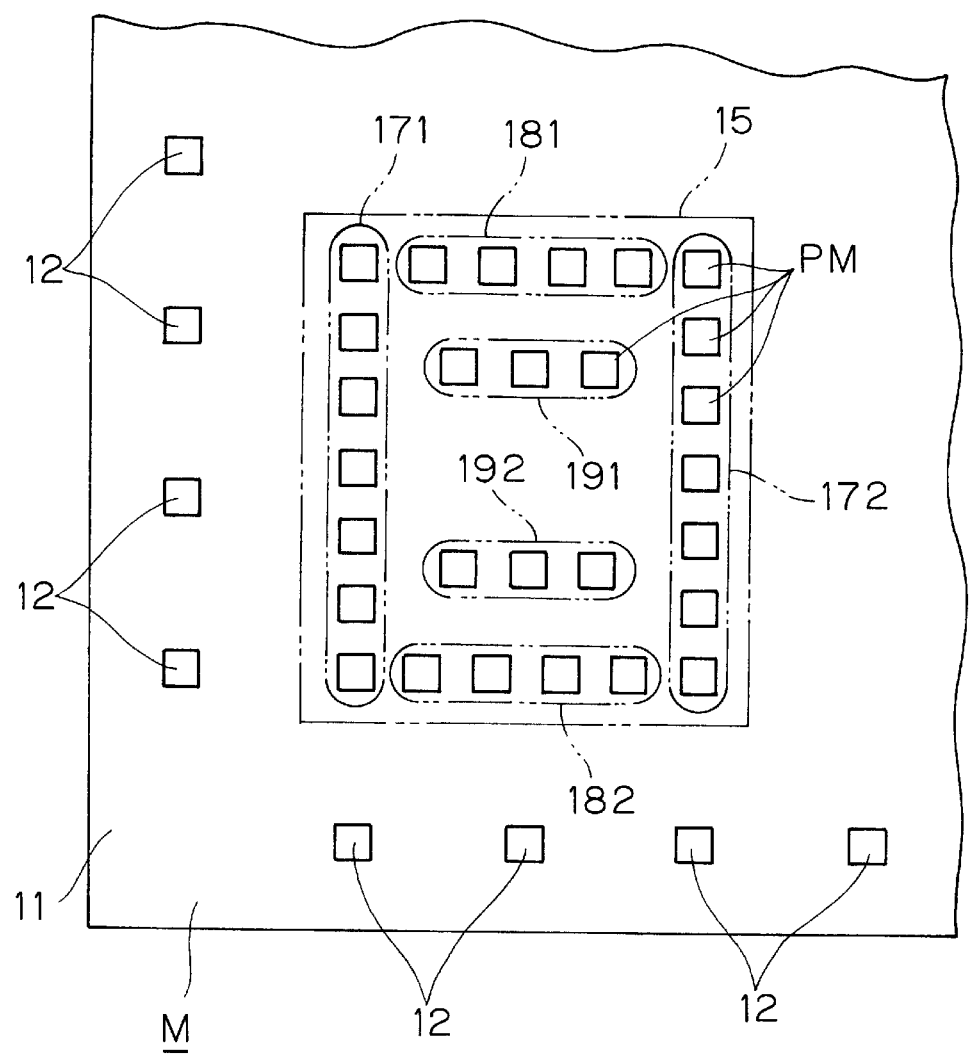
FIG. 2 is an enlarged partial plan view illustrating how the chip-to-chip connection pads are arranged in the daughter chip bonding region on the surface of the mother chip.

FIG. 2 is an enlarged partial plan view illustrating how the chip-to-chip connection pads PM are arranged in the bonding region 15 secured for the second daughter chip D2, constituting a memory device, on the surface 11 of the mother chip M. To this bonding region 15, any of a plurality of types of memory devices of varying grades can be bonded as the second daughter chip D2 with its surface facing downward. That is, the chip-to-chip connection pads PM formed in the bonding region 15 on the mother chip M are arranged in standardized positions so as to be compatible with the pad arrangement of a plurality of types of memory device chips.

Figure 3:
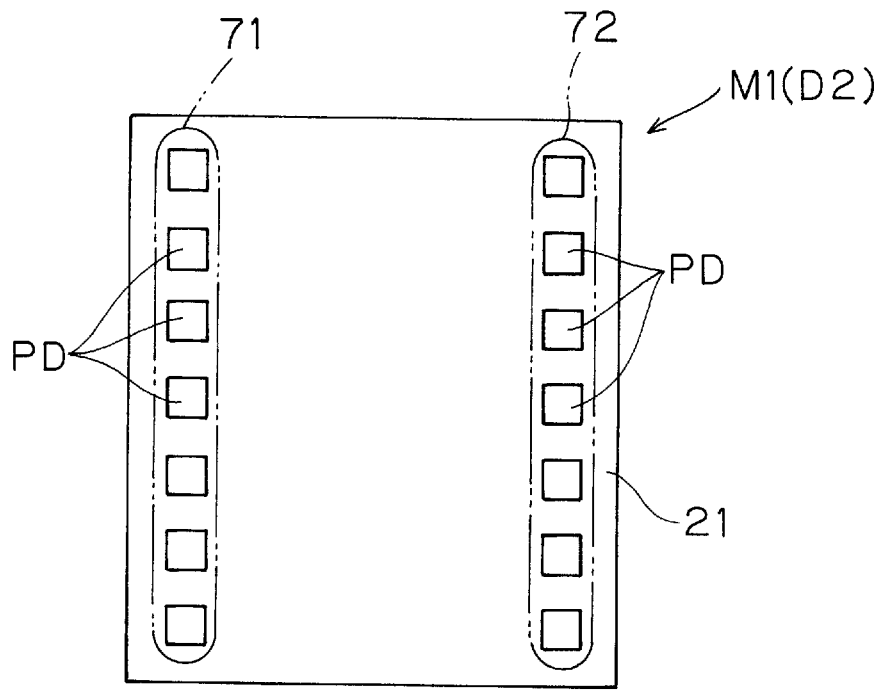
FIG. 3 is a simplified plan view of an example of a semiconductor chip constituting a memory device.
Figure 4:
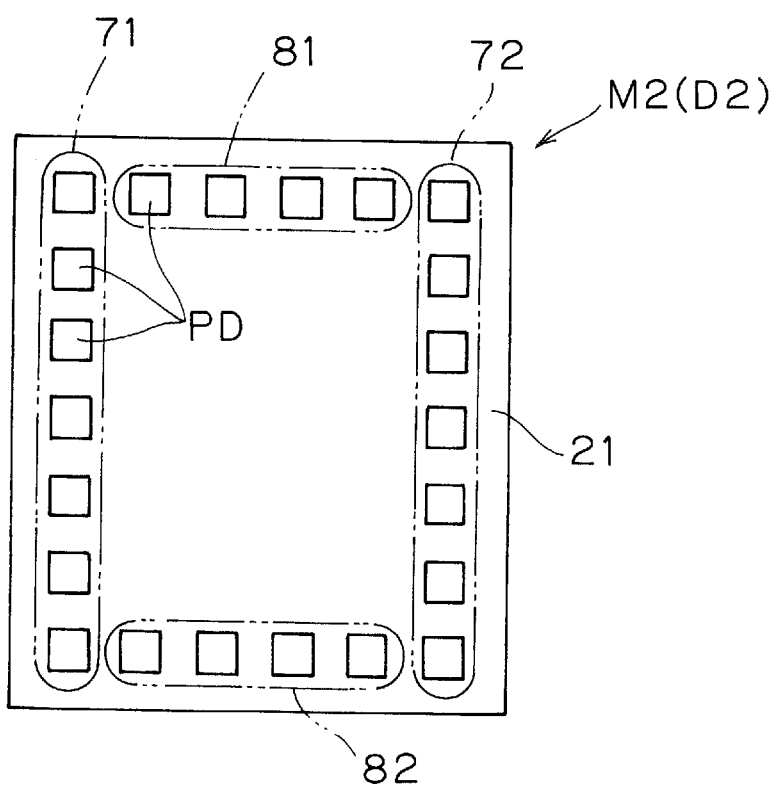
FIG. 4 is a simplified plan view of another example of a semiconductor chip constituting a memory device.
Figure 5:
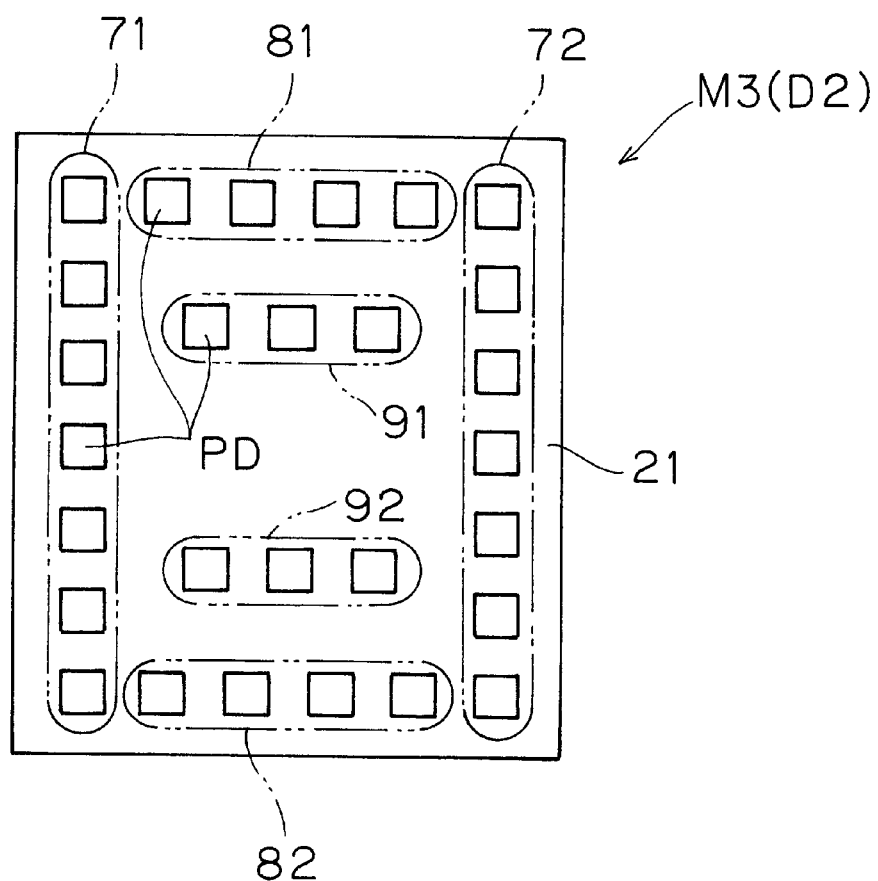
FIG. 5 is a simplified plan view of still another example of a semiconductor chip constituting a memory device.

FIGS. 3, 4, and 5 are simplified plan views of examples of the standardized positions of the pads PD on a plurality of types of memory device chips having varying storage capacities. For example, the memory device chip M1 shown in FIG. 3 has a storage capacity of 256 kilobytes, the memory device chip M2 shown in FIG. 4 has a storage capacity of 1 megabytes, and the memory device chip M3 shown in FIG. 5 has a storage capacity of 2 megabytes. All of these memory device chips are so structured as to be usable as the second daughter chip D2. Note that, in FIGS. 3 to 5, the bumps B formed on the pads PD are omitted.

The memory device chip M1 has a substantially rectangular surface 21. Here, the pads PD formed on this surface 21 include two groups 71 and 72 of pads arranged respectively along the two longer sides that lie opposite to each other. The memory device chip M2 has a rectangular surface 21 substantially congruent with that of the memory device chip M1. Here, the pads PD include, in addition to the two groups 71 and 72 of pads, another two groups 81 and 82 of pads arranged respectively along the two shorter sides. The memory device chip M3 has a rectangular surface 21 substantially congruent with those of the memory device chips M1 and M2. Here, the pads PD include, in addition to the groups 71, 72, 81, and 82 of pads, another two groups 91 and 92 of pads arranged respectively along the two shorter sides somewhat away from the edge.

Correspondingly, the chip-to-chip connection pads PM formed in the bonding region 15 on the mother chip M include two groups of pads 171 and 172 formed in positions corresponding to the groups 71 and 72 of pads, two groups of pads 181 and 182 formed in positions corresponding to the groups 81 and 82 of pads, and two groups of pads 191 and 192 formed in positions corresponding to the groups 91 and 92 of pads.

That is, the chip-to-chip connection pads PM formed in the bonding region 15 are formed in standardized positions so as to be compatible with the pads PD of all of the plurality of types of memory devices M1, M2, and M3 that have identical functions but are of varying grades. Correspondingly, the memory device chips M1, M2, and M3 have their pads PD arranged in positions corresponding to such standardized positions.

Thus, it is possible to bond any of the three types of memory device chips M1, M2, and M3 as the daughter chip D2 to the bonding region 15 of the mother chip 15 to produce a semiconductor device having a chip-on-chip structure. In other words, without any modification in its design, the mother chip M is compatible with any of the three types of memory device chips M1, M2, and M3. Thus, it is possible to produce three types of systems of varying grades without any modification or the like in the design of the mother chip M or in the design of the manufacturing line.

It is preferable to arrange pads in similar standardized positions also on the other daughter chips D1 and D3 that are bonded to the mother chip M on a chip-on-chip basis. This makes it possible to select an A/D conversion device chip that is to be bonded to the mother chip M from among a plurality of types offering varying conversion bit numbers, or to select a CPU chip that is to be bonded to the mother chip M from among a plurality of types offering varying processing bit numbers.

The present invention can be carried out in any other way than it is carried out in the embodiment described above. For example, although the above-described embodiment deals with a case in which three types of memory device chips M1, M2, and M3 having varying numbers of pads are used, it is also possible to standardize the arrangement of all of the pads PD on a plurality of types of memory device chips having identical numbers of pads but having varying capacities. Of course, even with memory device chips having identical numbers of pads, the arrangement of the pads PD may be modified as long as it is compatible with the arrangement of the chip-to-chip pads PM in the bonding region 15 on the mother chip M. The same is true also with AD conversion chips or CPU chips.

Moreover, although the above-described embodiment deals with a case in which the three types of memory device chips M1, M2, and M3 have substantially congruent shapes at least when seen in a plan view, they may be of varying sizes and shapes as long as they have pads PD arranged in standardized positions.

Furthermore, as long as the chip connection pads on a mother chip and the chip connection pads on a daughter chip are arranged in standardized positions, it is possible to bond various types of daughter chips, i.e. not only memory device chips, AID conversion chips, or CPU chips, but also LED driving circuits, motor driving circuits, digital-to-analog conversion devices, or the like, to a mother chip having a common design without modifying the design of the mother chip to produce a plurality of types of semiconductor devices having a chip-on-chip structure that are of varying grades as a whole.

Moreover, although the above-described embodiment deals with a case in which bumps B are formed on a daughter chip D, it is also possible to form similar bumps on a mother chip M, or form bumps on both the mother and daughter chips M and D so that chip-on-chip bonding between the mother and daughter chips M and D will be achieved by bonding the bumps together.

Moreover, instead of relatively high metal protrusions such as bumps, it is possible to use vapor-deposited metal films or the like.

Furthermore, although the above-described embodiment deals with a case in which three daughter chips D are bonded to the surface 11 of a mother chip M, it is possible to bond as many daughter chips on the surface 11 of the mother chip M as is required by the given system configuration.

Moreover, although the above-described embodiment deals with a case in which both a mother chip M and a daughter chip D are made of silicon, it is possible to use semiconductor chips made of any other material than silicon, such as gallium-arsenide or germanium, in semiconductor devices embodying the present invention. The first and second semiconductor chips may be made of either identical or different materials.

Obviously, many modifications and variations of the present invention are possible in light of the above teachings. It is therefore to be understood that within the scope of the appended claims, the invention may be practiced other than as specifically described.

What is claimed is:

1. A semiconductor device comprising a first semiconductor chip and a second semiconductor chip superposed on and bonded to a surface of the first semiconductor chip,
    wherein, in a chip bonding region on the surface of the first semiconductor chip where the second semiconductor chip is bonded to the first semiconductor chip, chip connection portions are arranged in standardized positions so as to fit a plurality of predetermined types of semiconductor chips,
    wherein, on the second semiconductor chip, chip connection portions are arranged so as to fit the chip connection portions arranged on the first semiconductor chip at least for one of the plurality of predetermined types of semiconductor chips, and
    wherein the chip connection portions arranged on the first semiconductor chip are arranged along at least one pair of opposite sides of the chip bonding region, a distance between the chip connection portions arranged along a first side of said at least one pair of opposite sides is shorter than a distance from the chip connection portions arranged along said first side of said at least one pair of opposite sides to the chip connection portions arranged along a second side of said at least one pair of opposite sides, and at least part of the chip connection portions arranged on the first semiconductor chip are common to the plurality of predetermined types of semiconductor chips so as to be used for input/output of signals having identical specifications.

2. A semiconductor device as claimed in claim 1,
    wherein the plurality of predetermined types of semiconductor chips have identical functions but are of different grades.

3. A semiconductor chip having, on a surface thereof, a chip bonding region that fits one of a plurality of predetermined types of semiconductor chips,
    wherein, in the chip bonding region, chip connection portions are arranged in standardized positions so as to fit any of the plurality of predetermined types of semiconductor chips, and
    wherein the chip connection portions arranged on the semiconductor chip are arranged along at least one pair of opposite sides of the chip bonding region, a distance between the chip connection portions arranged along a first side of said at least one pair of opposite sides is shorter than a distance from the chip connection portions arranged along said first side of said at least one pair of opposite sides to the chip connection portions arranged along a second side of said at least one pair of opposite sides, and at least part of the chip connection portions are common to the plurality of predetermined types of semiconductor chips so as to be used for input/output of signals having identical specifications.

4. A semiconductor chip as claimed in claim 3,
    wherein, on the plurality of predetermined types of semiconductor chips, chip connection portions are arranged in positions corresponding to the standardized positions.

5. A semiconductor chip as claimed in claim 3,
    wherein the plurality of predetermined types of semiconductor chips have identical functions but are of different grades.

6. A semiconductor chip having, on a surface thereof, a chip connection region that fits any of a plurality of predetermined types of semiconductor chips,
    wherein, in the chip connection region, chip connection portions are formed in standardized positions so as to fit any of the plurality of predetermined types of semiconductor chips, and the chip connection portions are arranged along an edge of the chip connection region, and
    wherein the chip connection portions are arranged along at least one pair of opposite sides of the chip connection region, a distance between the chip connection portions arranged along a first side of said at least one pair of opposite sides is shorter than a distance from the chip connection portions arranged along said first side of said at least one pair of opposite sides to the chip connection portions arranged along a second side of said at least one pair of opposite sides, and at least part of the chip connection portions are common to the plurality of predetermined types of semiconductor chips so as to be used for input/output of signals having identical specifications.

7. The semiconductor chip as claimed in claim 6,
    wherein the chip connection portions are arranged also in an inner portion of the chip connection region somewhat away from the edge thereof.

* * * * *